(12) United States Patent
Yamaguchi et al.

(10) Patent No.: US 8,053,850 B2
(45) Date of Patent: Nov. 8, 2011

(54) MINUTE STRUCTURE, MICROMACHINE, ORGANIC TRANSISTOR, ELECTRIC APPLIANCE, AND MANUFACTURING METHOD THEREOF

(75) Inventors: Mayumi Yamaguchi, Kanagawa (JP); Konami Izumi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 692 days.

(21) Appl. No.: 11/425,245

(22) Filed: Jun. 20, 2006

(65) Prior Publication Data

US 2007/0001224 A1 Jan. 4, 2007

(30) Foreign Application Priority Data

Jun. 30, 2005 (JP) ................................. 2005-193154

(51) Int. Cl.
*H01L 29/84* (2006.01)

(52) U.S. Cl. ........ 257/415; 257/414; 257/416; 257/417; 257/E29.324

(58) Field of Classification Search .................. 257/254, 257/415, 417, 419; 310/330, 349, 351
See application file for complete search history.

(56) References Cited

U.S. PATENT DOCUMENTS

| | | | |
|---|---|---|---|
| 5,808,331 A | 9/1998 | Zhang et al. | |
| 6,590,710 B2 | 7/2003 | Hara et al. | |
| 6,635,919 B1 * | 10/2003 | Melendez et al. | 257/312 |
| 6,657,832 B2 * | 12/2003 | Williams et al. | 361/15 |
| 6,821,811 B2 | 11/2004 | Hirakata et al. | |
| 6,860,939 B2 | 3/2005 | Hartzell | |
| 6,992,551 B2 * | 1/2006 | Shimizu et al. | 335/78 |
| 7,653,371 B2 | 1/2010 | Floyd | |
| 7,657,242 B2 | 2/2010 | Floyd | |
| 2003/0116711 A1 | 6/2003 | Hara et al. | |
| 2003/0196590 A1 | 10/2003 | Hartzell | |
| 2003/0196591 A1 | 10/2003 | Hartzell | |
| 2003/0196592 A1 | 10/2003 | Hartzell | |
| 2003/0196593 A1 | 10/2003 | Hartzell | |
| 2003/0197214 A1 | 10/2003 | Hartzell | |
| 2003/0199177 A1 | 10/2003 | Hartzell | |
| 2005/0062065 A1 | 3/2005 | Hirakata et al. | |
| 2005/0130360 A1 | 6/2005 | Zhan et al. | |

(Continued)

FOREIGN PATENT DOCUMENTS

EP  1126256 A2  8/2001

(Continued)

OTHER PUBLICATIONS

Office Action (Chinese Patent Application No. 200610099772.0) mailed Aug. 28 2009 w/translation.

*Primary Examiner* — Kenneth Parker
*Assistant Examiner* — Jose R Diaz
(74) *Attorney, Agent, or Firm* — Fish & Richardson P.C.

(57) ABSTRACT

A micromachine is generally formed using a semiconductor substrate such as a silicon wafer. One of the objects of the present invention is to realize further reduction in cost by integrating a minute structure and a semiconductor element controlling the minute structure over one insulating surface in one step. A minute structure has a structure in which a first layer formed into a frame-shape are provided over an insulating surface, a space is formed inside the frame, and a second layer is formed to cross over the first layer. Such a minute structure and a thin film transistor can be integrated over one insulating surface in one step.

17 Claims, 14 Drawing Sheets

U.S. PATENT DOCUMENTS

| | | |
|---|---|---|
| 2005/0153475 A1 | 7/2005 | Hartzell |
| 2006/0267153 A1 | 11/2006 | Yamaguchi |
| 2006/0270238 A1 | 11/2006 | Izumi |
| 2006/0284183 A1 | 12/2006 | Izumi |
| 2007/0015361 A1 | 1/2007 | Tateishi |
| 2007/0037311 A1 | 2/2007 | Izumi |
| 2007/0044579 A1 | 3/2007 | Yamaguchi |
| 2007/0078228 A1 | 4/2007 | Tateishi |
| 2007/0093045 A1 | 4/2007 | Yamaguchi |
| 2007/0111365 A1 | 5/2007 | Tateishi |
| 2007/0143048 A1 | 6/2007 | Yamaguchi |
| 2007/0152537 A1 | 7/2007 | Yamaguchi |
| 2007/0238213 A1 | 10/2007 | Yamaguchi |
| 2010/0117761 A1 | 5/2010 | Floyd |
| 2010/0149722 A1 | 6/2010 | Floyd |

FOREIGN PATENT DOCUMENTS

| | | |
|---|---|---|
| EP | 1645902 A2 | 4/2006 |
| JP | 2000090801 A | 3/2000 |
| JP | 2002174721 A | 6/2002 |
| JP | 2002-214548 | 7/2002 |
| JP | 2002214549 A | 7/2002 |
| JP | 2002-355798 | 12/2002 |
| JP | 2003340795 A | 12/2003 |
| JP | 2004-001201 | 1/2004 |
| JP | 2004080026 A | 3/2004 |
| JP | 2006100821 A | 4/2006 |

\* cited by examiner

MINUTE STRUCTURE, MICROMACHINE, ORGANIC TRANSISTOR, ELECTRIC APPLIANCE, AND MANUFACTURING METHOD THEREOF

BACKGROUND OF THE INVENTION

1. Field of the Invention

The present invention relates to a minute structure, a micromachine having the minute structure, an organic transistor having the minute structure and an electric appliance having the organic transistor. In addition, the present invention relates to a manufacturing method thereof.

2. Description of the Related Art

In recent years, a micro mechanical system called MEMS is actively researched. MEMS is an abbreviated name of a micro electro mechanical system, which is sometimes simply called a micromachine. A micromachine in general corresponds to a minute device in which "a movable micro structure having a three-dimensional structure" and "an electric circuit having a semiconductor element" are integrated. Unlike a semiconductor element, the foregoing micro structure has a three-dimensional structure and a movable portion.

In addition, a technique for forming each kind of device, which is a micromachine device, formed over a semiconductor substrate over one substrate at the same time (for example, see Patent Document 1) is suggested. [Patent Document 1] Japanese Patent Application Laid-Open No. 2002-355798

In such a micromachine, a structure using a thin film is suggested (for example, see Patent Document 2).
[Patent Document 2] Japanese Patent Application Laid-Open No. 2004-1201

As shown in Patent Document 1, a micromachine is generally formed using a semiconductor substrate such as a silicon wafer.

In Patent Document 1, an example in which a micro pump and a driver circuit thereof are mounted over one substrate is disclosed. However, an example in which the micro pump and the driver circuit are formed over one substrate in one step is not disclosed. In addition, in Patent Document 1, a structure in which a micro mixer or the like and a diaphragm pump used as a sample or a pump thereof are formed over one substrate integrally is disclosed. It is disclosed that each kind of device can be formed easily over one substrate at the same time because the structure can be formed in one step. However, in Patent Document 1, a semiconductor element for controlling a device such as a micro mixer is not formed over one substrate in one step.

In Patent Document 2, a structure of a thin-film shaped micromachine which is crystallized is mentioned. However, a description of a semiconductor device to control a micromachine is not made, and of course there is no description of a device in which a semiconductor device is formed integrally.

SUMMARY OF THE INVENTION

In view of the foregoing, the present invention provides a minute structure with a novel structure having a frame-shape. In addition, according to the present invention, such a minute structure and a semiconductor element which controls the minute structure are integrated in one step over the insulating surface.

In addition, a minute structure of the present invention having a frame-shape has high light transmittance. By applying such a minute structure as a switching element of a display portion, a display portion with a high aperture ratio can be provided.

A structure of the present invention is specifically described below.

One example of the present invention is a minute structure which comprises a first layer and a second layer formed over an insulating surface, in which the first layer is a pair of walls and the second layer is a bridge crossing the walls.

Another example of the present invention is a minute structure which comprises a first layer and a second layer formed over an insulating surface, in which the first layer has a shape of a frame, the second layer is formed so as to cross over the frame, and a space is formed inside the frame below the second layer.

Another example of the present invention is a minute structure which comprises a first layer and a second layer formed over an insulating surface, in which the first layer has a shape of a frame, the second layer is formed so as to cross over the frame from a side to another side which is opposite to the side, a space is formed inside the frame below the second layer, and a lower surface of the second layer is in contact with a side surface of the frame.

Another example of the present invention is a micromachine which comprises a plurality of minute structures including a first layer and a second layer formed over an insulating surface, in which the first layer is a pair of walls and the second layer is a bridge crossing the walls.

Another example of the present invention is a micromachine which comprises a plurality of minute structures including a first layer and a second layer formed over an insulating surface, in which the first layer has a shape of a frame, the second layer is formed so as to cross over the frame, and a space is formed inside the frame below the second layer.

Another example of the present invention is a micromachine which comprises a plurality of minute structures including a first layer and a second layer formed over an insulating surface, in which the first layer has a shape of a frame, the second layer is formed so as to cross over the frame from a side to another side which is opposite to the side, a space is formed inside the frame below the second layer, and a lower surface of the second layer is in contact with a side surface of the frame.

Another example of the present invention is a micromachine which comprises a plurality of minute structures including a conductive layer formed over an insulating surface, a first layer, and a second layer; in which the first layer and the second layer are provided over the conductive layer, the first layer has a shape of a frame, the second layer is formed so as to cross over the frame, and a space is formed inside the frame below the second layer.

Another example of the present invention is an organic transistor which comprises a first layer and a second layer formed over an insulating surface, in which the first layer is a pair of walls, the second layer is a bridge crossing the pair of walls, and an organic semiconductor layer is formed inside the frame and below the bridge.

Another example of the present invention is an organic transistor which comprises a first layer and a second layer formed over an insulating surface, and a conductive layer formed below the first layer; in which the first layer has a shape of a frame, the second layer is formed so as to cross over the frame, a space is formed inside the frame below the second layer, and an organic semiconductor layer is formed in the space.

Another example of the present invention is an organic transistor which comprises a first layer and a second layer formed over an insulating surface, and a conductive layer formed below the first layer; in which the first layer has a shape of a frame, the second layer is formed so as to cross over the frame, a space is formed inside the frame below the second layer, an organic semiconductor layer formed in the space, and the second layer is formed of a conductive material.

Another example of the present invention is an organic transistor which comprises a conductive layer formed over an insulating surface, and a first layer and a second layer formed over the conductive layer, in which the first layer has a shape of a frame, the second layer is formed so as to cross over the frame, a space is formed inside the frame below the second layer, an organic semiconductor layer is formed in the space, and the second layer is formed of a conductive material.

Another example of the present invention is an electric appliance comprises an organic transistor in a display portion, in which the organic transistor includes a first layer and a second layer formed over an insulating surface, in which the first layer is a pair of walls, the second layer is a bridge crossing over the pair of walls, and an organic semiconductor layer is formed inside the pair of walls and below the bridge.

Another example of the present invention is an electric appliance comprises an organic transistor in a display portion, in which the organic transistor includes a first layer and a second layer formed over an insulating surface, in which the first layer has a shape of a frame, the second layer is formed so as to cross over the frame, a space is formed inside the frame below the second layer, and an organic semiconductor layer is formed in the space.

Another example of the present invention is an electric appliance comprises an organic transistor in a display portion, in which the organic transistor includes a first layer and a second layer formed over an insulating surface, and a conductive layer formed below the first layer; in which the first layer has a shape of a frame, the second layer is formed so as to cross over the frame, a space is formed inside the frame below the second layer, an organic semiconductor layer is formed in the space, and the second layer is formed of a conductive material Another example of the present invention is an electric appliance comprises an organic transistor in a display portion, in which the organic transistor includes a conductive layer formed over an insulating surface, and a first layer and a second layer formed over the conductive layer; in which the first layer has a shape of a frame, the second layer is formed so as to cross over the frame, a space is formed inside the frame below the second layer, an organic semiconductor layer is formed in the space, and the second layer is formed of a conductive material.

In addition, the present invention includes a manufacturing method of a minute structure, a micromachine, an organic transistor, or an electric appliance.

According to the present invention, a minute structure and a semiconductor element for controlling the minute structure can be integrated over one surface in one step, thereby providing a micromachine which can be manufactured at a low cost.

In addition, miniaturization of a sensor device or the like over which a micromachine is mounted can be realized since a connection region between a minute structure and a semiconductor element controlling the minute structure is not required.

Further, by integrating a minute structure and a semiconductor element for controlling the minute structure over one surface, the minute structure can be arrayed, thereby a large scale integrated device can be provided.

DETAILED DESCRIPTION OF THE INVENTION

Figure 1:
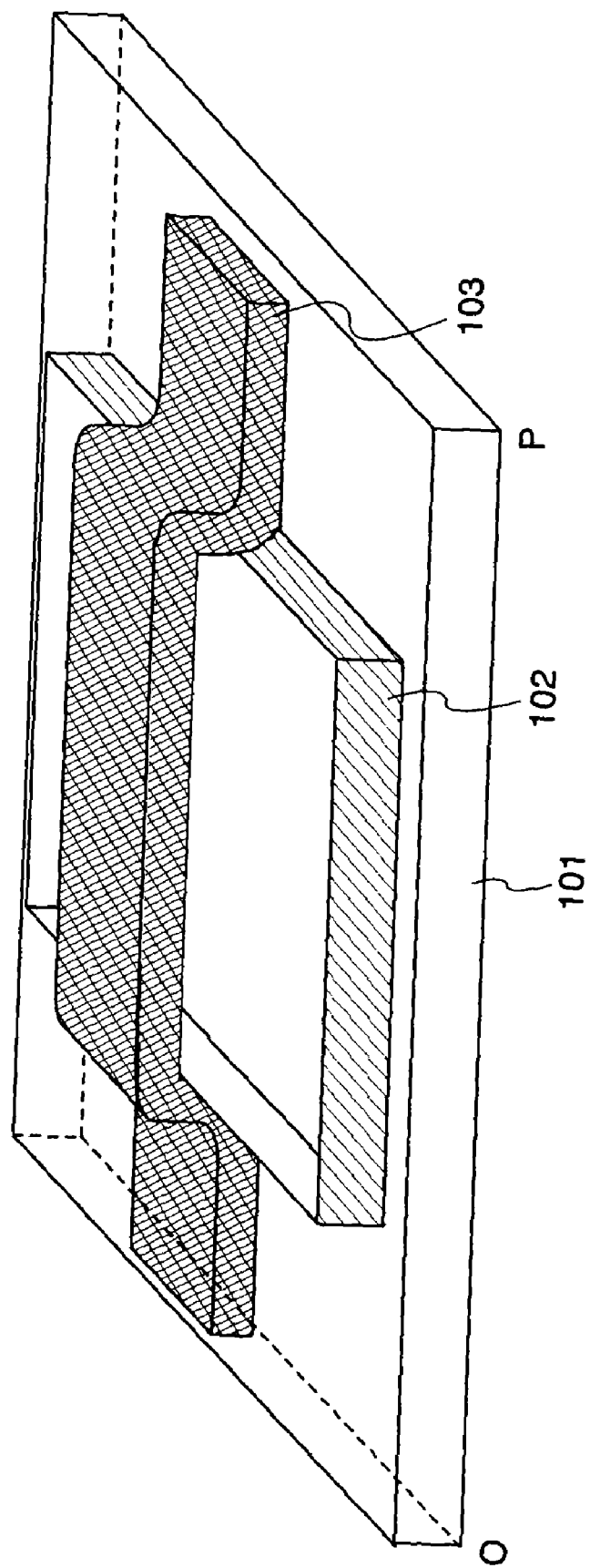
FIG. 1 shows a minute structure of the present invention.

Hereinafter, the embodiment modes of the present invention will be described with reference to the accompanying drawings. The present invention can be carried out in many different modes, and it is easily understood by those skilled in the art that modes and details herein disclosed can be modified in various ways without departing from the purpose and the scope of the present invention. Accordingly, the present invention should not be interpreted as being limited to the description of the embodiment modes to be given below. Note that in the drawings, the same reference numerals are used for the same portions or the portions having the same functions and repeated description of the portions will be omitted.

Embodiment Mode 1

In this embodiment mode, a structure of a minute structure is described.

As shown in FIG. 1, a minute structure of the present invention has a first layer 102 having a frame-shape over an insulating surface 101. In other words, the frame formed of the first layer 102 is two pairs of walls. Note that a space 105 needs to be provided below the second layer 103; therefore, a frame supporting the second layer 103 may have at least two sides. That is, at least one pair of walls is formed.

The space is provided inside the frame formed of the first layer 102. In other words, a space is provided so as to be surrounded by the frame. The insulating surface is a surface of a glass substrate, a quartz substrate, a plastic substrate, or the like. By forming a minute structure over a plastic substrate, a device with high flexibility and a thin thickness can be formed. In addition, a glass substrate which is thinned by polishing may be used. By polishing, a thin device can be formed. In addition, a minute structure can be formed over a conductive substrate such as metal or the like, or a substrate of a layer having an insulating property (insulating layer) formed over a semiconductor substrate such as silicon.

The first layer 102 can be formed of an insulator having silicon. For example, the first layer 102 can be formed of an oxide having silicon (silicon oxide), or a nitride having silicon (silicon nitride) and have a single-layer structure or a stacked-layer structure.

The second layer 103 is formed to cross over the first layer 102 having a frame-shape. That is, the second layer 103 has a bridge-shape. In other words, the second layer 103 has a shape of a bridge crossing a pair of walls. The second layer 103 can be formed of an insulator having silicon or a conductor and have a single-layer structure or a stacked-layer structure. As the conductor, a material used for an electrode is favorable and may be formed of a metal material such as a titanium (Ti), aluminum (Al), molybdenum (Mo), and tungsten (W); or a compound of the metal material (such as metal oxide and metal nitride). An element such as neodymium (Nd) and scandium (Sc) are preferably added to a material with low heat resistance such as aluminum (Al) so as to avoid a hillock due to heating. Note that neodymium is favorable to be used as a material to be added since resistance of aluminum is not heightened due to neodymium rather than a scandium.

A manufacturing method of such a minute structure is described with reference to FIGS. 2A to 2D.

Figure 2A:
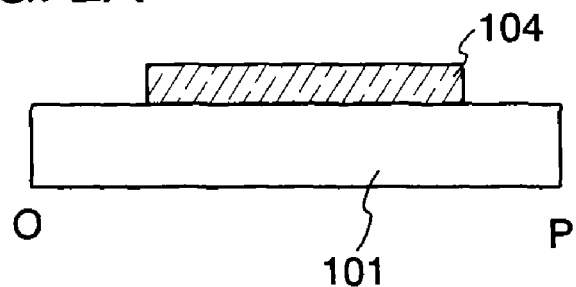
FIGS. 2A to 2D show a manufacturing process of a minute structure of the present invention.

As shown in FIG. 2A, a sacrifice layer 104 is formed over an insulating surface and patterned into a predetermined shape. Note that the sacrifice layer is a layer which is removed in a subsequent step. Removing of the sacrifice layer provides a space in which a structure layer moves. The sacrifice layer may be a conductive layer or an insulating layer as long as an etching selection ratio can be obtained between the sacrifice layer and another material so that the sacrifice layer is removed.

Figure 2B:
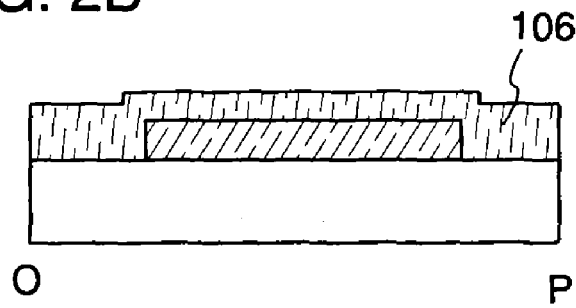

Then, as shown in FIG. 2B, a first layer 106 is formed of a silicon oxide, a silicon nitride, or the like over the sacrifice layer 104. A silicon oxide, a silicon nitride, and the like can be formed by a CVD method, a sputtering method, a droplet discharging method (typically, an ink jet printing method), or a spin coating method. A droplet discharging method and a spin coating method can be employed when an organic material is a starting material.

At this time, unevenness may be formed on a surface of the first layer 106 in accordance with the shape of the sacrifice layer 104. Note that when an organic material is used as a starting material, unevenness is hard to be formed, so that planarity can be enhanced.

Figure 2C:
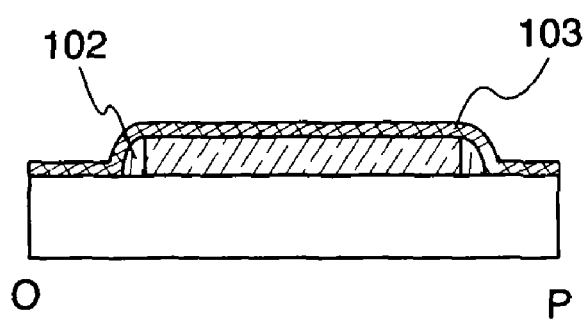

Then, as shown in FIG. 2C, the first layer is etched so as to be only in contact with the side surfaces of the sacrifice layer 104 and have a frame-shape. As the etching, dry etching or wet etching can be employed. In the case of dry etching, an etching gas containing $CHF_3$, $ClF_3$, $NH_3$, $CF_4$, and the like can be used. In the case of wet etching, an etchant containing oxygenated water or an etchant containing a buffered hydrogen fluoride can be used.

As described above, the first layer which remains only at the side surface of the sacrifice layer 104 exists around the sacrifice layer 104 and has a frame-shape. Such a structure is called a sidewall structure. The frame is tapered to its point and gets thicker to its bottom, thereby being tougher. Note that in the first layer 102 having a sidewall structure, a film thickness or a height of a sidewall is decided depending on an etching condition as well as a film thickness of the first layer on deposition. Therefore, the whole of the sacrifice layer 104 inside the frame is not necessarily to be etched and removed. The sacrifice layer 104 may remain in a lower portion of the frame. That is, the sacrifice layer 104 is etched so as to form a space.

Then, the second layer 103 is formed so as to cover the first layer 102 and the sacrifice layer 104 and patterned into a predetermined shape. In this embodiment mode, the second layer 103 is patterned into an elongated rectangular shape which crosses over the first layer 102 and the sacrifice layer 104. That is, the second layer 103 has a bridge-shape selectively formed over the first layer 102 and the sacrifice layer 104. In this embodiment mode, the second layer 103, that is, the bridge is extended outside of the first layer 102. Thus, the second layer 102 can be tougher.

A part of the sacrifice layer 104 is exposed since the second layer 103 is selectively formed. The sacrifice layer in which a part is exposed can be removed by etching. That is, it is desired that the second layer 103 is formed so that a part of the sacrifice layer 104 is exposed.

Figure 2D:
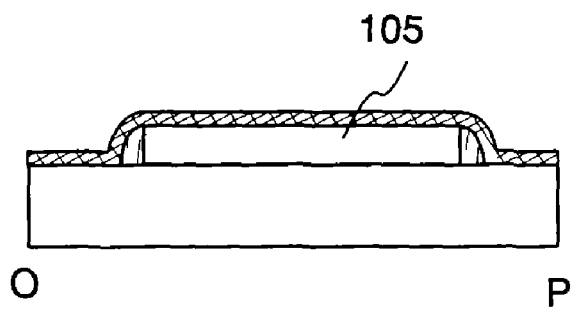

Thereafter, as shown in FIG. 2D, the sacrifice layer 104 is removed. Dry etching or wet etching is employed to remove the sacrifice layer 104. Materials for the first layer 102, the second layer 103, and the sacrifice layer 104 are selected and the etching condition is set so that only the sacrifice layer 104 is etched selectively. That is, materials which can have a selection ratio between the sacrifice layer 104 against a specific etchant can be used for the first layer 102 and the second layer 103.

By removing the sacrifice layer 104, the space 105 is formed. In other words, the space 105 is provided in the first layer 102 which is formed so as to have a frame-shape. The frame can be referred to as two pairs of walls. Note that the space 105 needs to be provided below the second layer 103, therefore, a frame supporting the second layer 103 may have at least two sides opposite to each other. That is, at least one pair of walls is formed.

Thus, a minute structure which has the first layer having a frame-shape, the second layer having a bridge-shape crossing over the frame, and the space provided below the second layer and inside the frame can be formed. The second layer formed over the space can be moved by an electric signal or static electricity caused by voltage applied to the second layer. The second layer can move (or vibrate) up and down, for example.

Such a frame can be used as a mold in which a material which is difficult to be processed is poured and baked. For example, ZnO, which is difficult to be etched, or an organic material, which has low heat resistance, is poured, thereby a new device can be provided.

In addition, electroplating may be conducted to the frame so that a mirror surface can be made. Such a device can be used as an optical device.

Such the frame made of the first layer can be processed minutely compared to patterning with conventional etching.

A micromachine which is integrated in a large scale can be provided by forming a plurality of minute structures. With a large scale integrated device, a micromachine having a specific function can be provided.

Embodiment Mode 2

In this embodiment mode, a structure of a measurement element using a minute structure is described.

Figure 3:
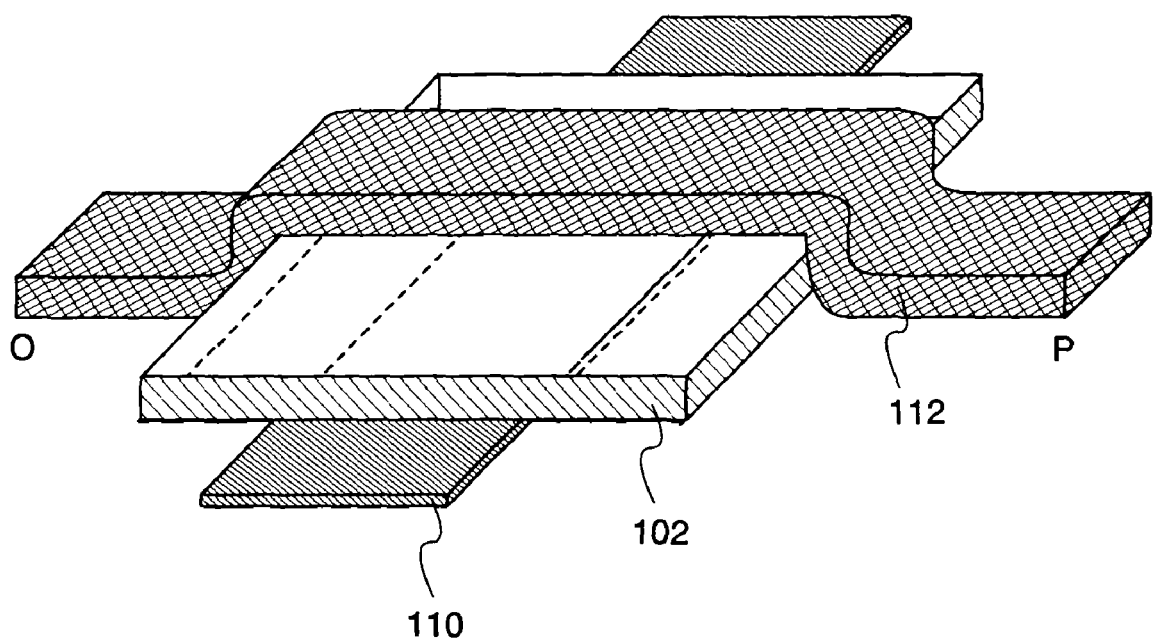
FIG. 3 shows a measurement element of the present invention.

As shown in FIG. 3, in a minute structure as described above, a conductor (hereinafter, referred to as a lower electrode since it serves as a lower electrode) 110 is formed below a sacrifice layer and patterned into a predetermined shape. The lower electrode 110 can be formed of a metal material such as titanium (Ti), aluminum (Al), molybdenum (Mo), and tungsten (W); or a compound of the metal material (such as metal oxide and metal nitride). An element such as neodymium (Nd) and scandium (Sc) are preferably added to a material with low heat resistance such as aluminum (Al) so as to avoid a hillock due to heating. Note that neodymium is favorable to be used as a material to be added since resistance of aluminum is not heightened due to neodymium rather than scandium.

Then, the sacrifice layer is formed over the lower electrode 110 and patterned into a predetermine shape as described in the foregoing embodiment mode.

Thereafter, a first layer is formed over the sacrifice layer and etched into a sidewall structure as described in the foregoing embodiment mode.

In addition, a second layer is formed so as to cross over the first layer and the sacrifice layer. In this embodiment mode, a conductive layer 112 is used as the second layer. As the conductive layer 112, a metal material such as titanium (Ti), aluminum (Al), molybdenum (Mo), and tungsten (W); or a compound of the metal material (such as metal oxide and metal nitride) can be used. An element such as neodymium (Nd) and scandium (Sc) are preferably added to a material with low heat resistance such as aluminum (Al) so as to avoid a hillock due to heating. Note that neodymium is favorable to be used as a material to be added since resistance of aluminum is not heightened due to neodymium rather than scandium.

In this structure, an insulating layer may be formed below the conductive layer. As the insulating layer, a silicon oxide or a silicon nitride is used. Then, the conductive layer 112 is patterned as described in the foregoing embodiment mode. At this time, patterning is conducted so that a part of the sacrifice layer is exposed.

Thereafter, as described in the foregoing embodiment mode, the sacrifice layer is removed, thereby forming a structure in which the first layer 102 has a sidewall structure and the conductive layer 112 is formed over the first layer 102. Since the sacrifice layer is removed, a space is provided in the first layer 102. That is, a capacitor is formed by the lower electrode 110 and the conductive layer 112 with the space therebetween. The conductive layer 112 is movable. In specific, the conductive layer 112 over the space can move up and down, so that a value of the capacitor changes.

Such a minute structure can serve as a measurement element by reading the value changed. That is, in such a minute structure serves as an element which can measure variable capacity. By forming a plurality of such minute structures, a sensor device including a sensor circuit for sensing variable capacity can be provided.

A minute structure of the present invention can be manufactured at a low cost compared with a minute structure using a silicon wafer. In addition, as described in the following embodiment modes, the minute structure and a semiconductor element for controlling the minute structure can be formed over one substrate. With such a minute structure of the present invention, a cost of a measurement element and a sensor device can be lowered.

A micromachine which is integrated in a large scale can be provided by forming a plurality of minute structures. With a large scale integrated device, a micromachine having a specific function can be provided.

Embodiment Mode 3

In this embodiment mode, a structure of an element which is different from that of the foregoing embodiment modes is described.

In a minute structure shown in FIG. 1, the second layer 103 can be used as a filament and the minute structure of the present invention can be applied to a protective circuit. When excessive voltage is applied to the second layer 103, the second layer 103 is cut; therefore, the minute structure can be used as a protective circuit. In the case where the second layer 103 is not to be cut, if a physical property of the second layer 103 changes due to current applied to the second layer 103, the minute structure can be used as a protective circuit by utilizing the change in a property.

When the minute structure is used as a protective circuit, the second layer 103 is preferably formed with a conductor.

Embodiment Mode 4

In this embodiment mode, a structure of a measurement element which is different from that of the foregoing embodiment modes is described.

Figure 14A:
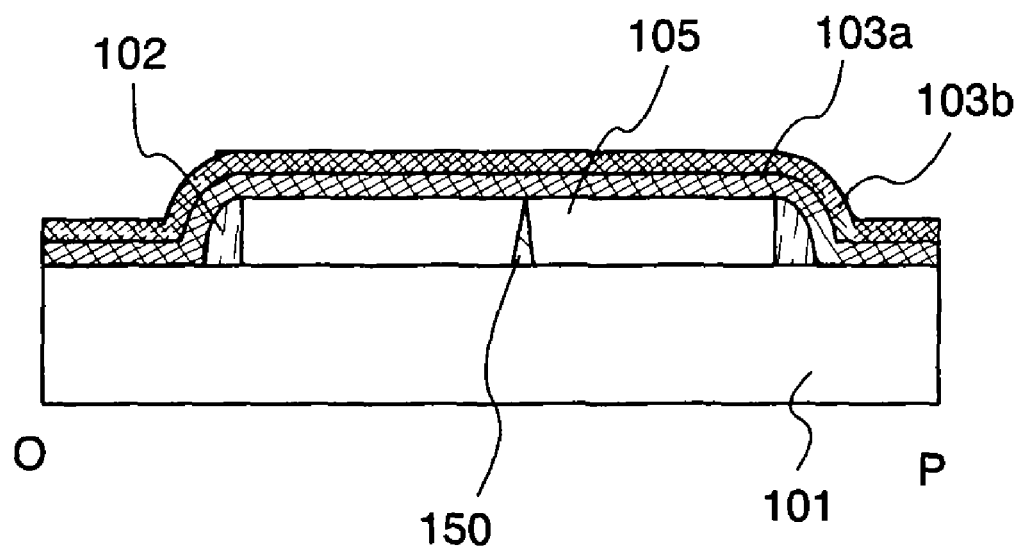
FIGS. 14A and 14B show a measurement element of the present invention.

An element which has the first layer 102 having a sidewall structure over the insulating surface 101, a needle (or a protrusion) 150 formed in the space, a second layer 103 having stacked layers (an lower layer 103a and an upper layer 103b) is shown in FIG. 14A. The lower layer 103a and the upper layer 103b of the second layer are stacked each using a material having thermal conductivity different from each other.

In a certain ambient temperature, a point of the needle (or a protrusion) 150 is in contact with the lower layer 103a of the second layer.

Figure 14B:
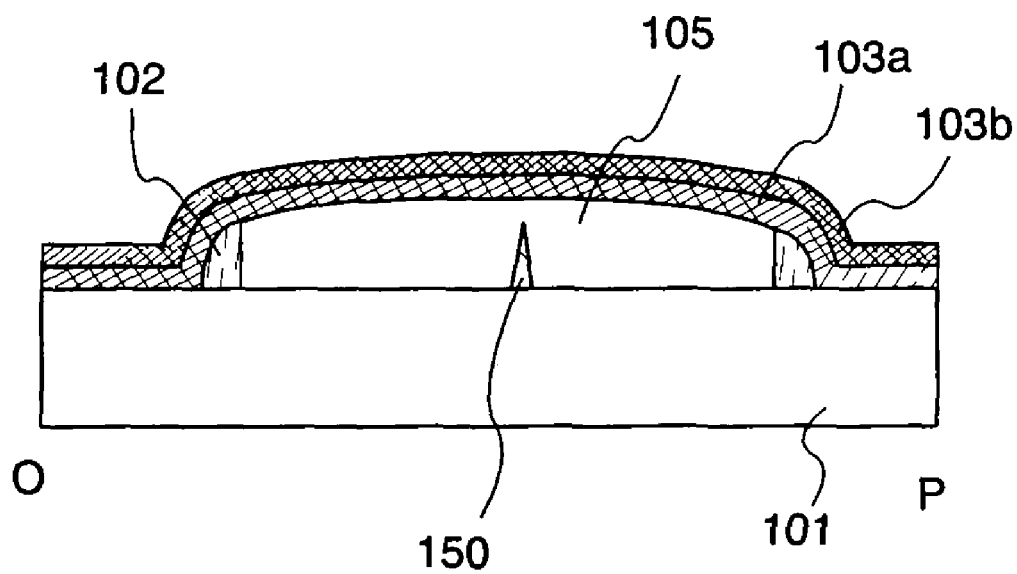

In another ambient temperature, as shown in FIG. 14B, the point of the needle (or a protrusion) 150 is not in contact with the lower layer 103a of the second layer. This is because warpage is generated in the second layer due to a difference in thermal conductivity between the lower layer 103a and the upper layer 103b of the second layer. Besides, the space provided below the second layer enables warpage in the second layer to be generated.

The measurement element can be applied as a switching element by utilizing such characteristics.

Embodiment Mode 5

In this embodiment mode, a manufacturing process of a semiconductor device which has the foregoing measurement element and a semiconductor element controlling the measurement element is described. In this embodiment mode, a thin film transistor (TFT) is used as the semiconductor device.

Figure 4A:
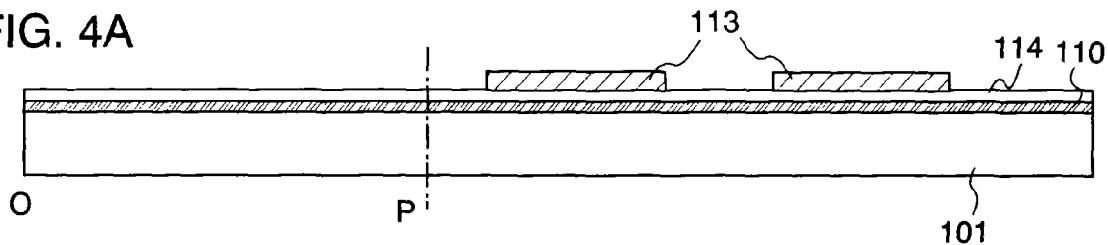
FIGS. 4A to 4E show a manufacturing process of a semiconductor device of the present invention.

As shown in FIG. 4A, a lower electrode 110 is formed over an insulating surface 101. As a manufacturing method, a material, and the like of the lower electrode 110, the foregoing embodiment modes can be referred. In this embodiment mode, the lower electrode 110 is formed in a first region where a minute structure is formed and a second region where a semiconductor element is formed. In the first and second regions, the lower electrode 110 is processed, that is, patterned into a predetermined shape so as to serve as the lower electrode of the measurement element and the lower electrode of the semiconductor element. By forming the lower electrode of the semiconductor element, leak current which is caused in accordance with miniaturization of the semiconductor element can be suppressed.

Then, a base film 114 is formed over the lower electrode 110. The base film 114 can be formed of a single-layer or stacked-layer structure of an insulating layer such as a layer formed with an oxide having silicon or a nitride having silicon, for example, a silicon oxide layer, a silicon nitride layer, a silicon oxide nitride layer, and the like are employed. As a stacked-layer structure, a structure in which a silicon oxide nitride layer formed using a reactive gas such as $SiH_4$, $NH_3$, $N_2O$, and $H_2$; and a silicon oxide nitride layer formed using a reactive gas such as $SiH_4$ and $N_2O$ are formed sequentially can be employed. The base film 114 can prevent contamination from the insulating surface 101 and the like. In addition, a stacked-layer structure is favorable since a layer which prevents the contamination effectively and a layer with high adhesion to the lower electrode 110 and a semiconductor layer formed later can also be stacked.

Then, a semiconductor layer 113 is formed only in the second region and patterned into a predetermine shape. The semiconductor layer can be formed of a material having silicon. The material having silicon includes a material formed of silicon and a silicon germanium material containing germanium at 0.01 to 4.5 atomic %. As the semiconductor layer 113, a semiconductor layer having a crystalline state or an amorphous state can be used. In this embodiment mode, a polycrystalline silicon layer crystallized by applying a thermal treatment using a metal to an amorphous silicon layer is used. A heating furnace, laser irradiation, or light irradiation generated from a lamp instead of laser light (hereinafter referred to as lamp annealing), or a combination thereof can be used for the thermal treatment.

In the case of forming polycrystalline silicon by laser irradiation, a continuous wave laser beam (CW laser beam) or a pulsed wave laser beam (pulsed laser beam) can be used. As the laser beam, a laser beam oscillated from one or a plurality selected from Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser can be used. By emitting a laser beam of second to fourth harmonics of a fundamental harmonic in addition to the fundamental harmonic of the foregoing laser beams, a crystal having a large grain diameter can be obtained. For instance, a second harmonic (532 nm) or a third harmonic (355 nm) of Nd: $YVO_4$ laser (fundamental, 1064 nm) can be used. The laser requires energy density of approximately from 0.01 to 100 $MW/cm^2$ (preferably, approximately from 0.1 to 10 $MW/cm^2$). The laser is emitted at a scanning rate of approximately from 10 to 2000 cm/sec.

Note that a continuous wave fundamental harmonic laser beam and a continuous wave higher harmonic laser beam may be emitted. Alternatively, a continuous wave fundamental harmonic laser beam and a pulsed wave higher harmonic laser beam may be emitted. By emitting a plurality of laser beams, energy can be supplied each other.

A laser beam, which is a pulsed wave laser beam, and which can oscillate laser at an oscillation frequency capable of emitting laser light of a next pulse during the period between melting due to laser light and solidifying of the semiconductor layer can also be used. By oscillating the laser beam at such a frequency, crystal grains that are continuously grown in the scanning direction can be obtained. A specific oscillation frequency of the laser beam is 10 MHz or higher, which means a notably high frequency band is used compared with a frequency band of several tens to several hundreds Hz that is generally used.

In the case of using a heating furnace as another thermal treatment, an amorphous semiconductor layer is heated at 400 to 550° C. for 2 to 20 hours. At this time, the temperature is preferably set at multi-steps in the range of 400 to 550° C. so as to increase gradually. By an initial low-temperature heating process at approximately 400° C., hydrogen or the like in the amorphous semiconductor layer is released. Accordingly, roughness of a film due to crystallization can be reduced. Moreover, a metal element that promotes crystallization, for example, nickel (Ni) is preferably formed over the amorphous semiconductor layer since a heating temperature can be reduced. As a metal element, iron (Fe), ruthenium (Ru), rhodium (Rh), palladium (Pd), osmium (Os), iridium (Ir), platinum (Pt), copper (Cu), gold (Au), cobalt (Co), or the like can be used.

In addition to the heating furnace, laser irradiation as described above may be performed to form polycrystalline silicon.

By performing a thermal treatment using a metal element, the polycrystalline silicon formed in this manner has almost the same crystal structure as that of single crystalline silicon. Such a structure is tougher and has higher mobility than polycrystalline silicon formed by a thermal treatment without using a metal element. This is because polycrystalline silicon in which crystal grains are continuously formed can be formed by a thermal treatment using a metal element. In polycrystalline silicon in which crystal grains are continuously formed, covalent bonds in crystal grain boundaries do not break, unlike polycrystalline silicon formed by a thermal treatment without using a metal element. Therefore, a stress concentration due to a defect in a crystal grain boundary does not occur, which results in a large fracture stress as compared to polycrystalline silicon formed without using a metal element. Further, as electron mobility is high due to continuous crystal grain boundaries, polycrystalline silicon in which crystal grains are continuously formed is suitable as a material used for controlling a minute structure.

Note that, a metal element used for crystallization becomes a contaminant source, and therefore it is required to be removed after crystallization. In this case, by forming and then heating a layer serving as a gettering sink over a silicon layer after a thermal treatment using a metal element, the metal element can be removed or reduced. That is because a metal element is moved into the gettering sink by thermal treatment. The gettering sink can be formed of a polycrystalline semiconductor layer or an amorphous semiconductor layer. For example, a polycrystalline semiconductor layer to which an inactive element such as argon is added can be formed to be used as a gettering sink. By adding an inactive element, the polycrystalline semiconductor layer can have a distortion, by which the metal element can be effectively captured. Further, by forming a semiconductor layer to which an element such as phosphorus is added, the metal element can be captured.

Figure 4B:
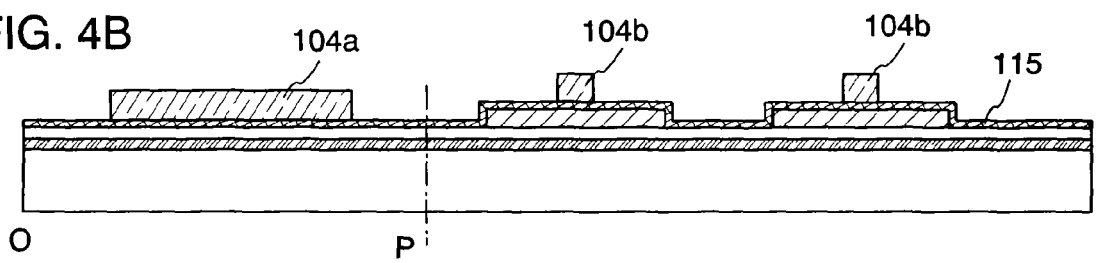

As shown in FIG. 4B, an insulating layer 115 is formed in the first region and the second region so as to cover the semiconductor layer 113. The insulating layer 115 serves as a gate insulating layer in the second region. In addition, the insulating layer 115 in the first region may be removed. The insulating layer 115 can be formed of a silicon oxide and a silicon nitride like the base film 114 and have a single-layer structure or a stacked-layer structure.

Then, in the first region and the second region, a conductive layer is formed over the insulating layer 115. The conductive layer serves as a sacrifice layer 104a in the first region and serves as a gate electrode 104b in the second region. As such a conductive layer, an element selected from Ta, W, Ti, Mo, Al, and Cu; an alloy material or a compound material containing the element may be used as a main component. An element such as neodymium (Nd) and scandium (Sc) are preferably added to a material with low heat resistance such as aluminum (Al) so as to avoid a hillock due to heating. Note that neodymium is favorable to be used as a material to be added since resistance of aluminum is not heightened due to neodymium rather than a scandium. In addition, as a conductive layer serves as the sacrifice layer 104a and the gate electrode 104b, a semiconductor layer typified by a polycrystalline film doped with an impurity element such as phosphorus, or an AgPdCu alloy can be used. This conductive layer can have a single-layer structure or a stacked-layer structure.

Figure 4C:
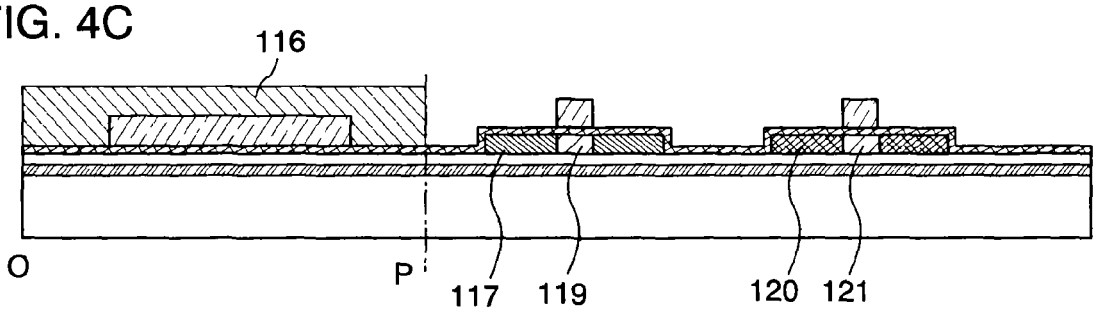

As shown in FIG. 4C, an impurity element is added to the semiconductor layer using the gate electrode 104b in a self-alignment manner. In the case of forming an n-type semiconductor element, phosphorus (P) or arsenic (As) are added to form an impurity region 117 and a channel forming region 119. In the case of forming a p-type semiconductor element, boron or the like is added to form an impurity region 120 and a channel forming region 121. Note that the impurity region can be referred to as a source region or a drain region, depending on a flowing direction of current.

At this time, a mask 116 is selectively formed in the first region so as to prevent the impurity element from being added. The mask can be formed of an organic material and an inorganic material.

Figure 4D:
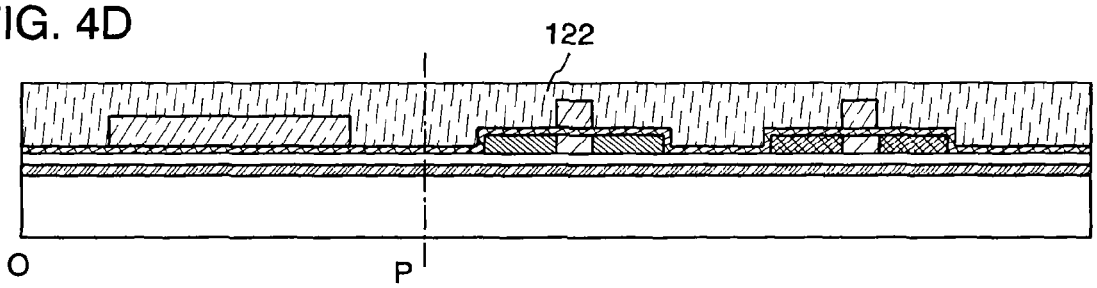

Then, as shown in FIG. 4D, the mask 116 is removed and an insulating layer 122 is formed so as to cover the sacrifice layer 104a, a gate electrode 104b, and the like. The insulating layer 122 is etched to be the first layer 102 having a sidewall structure. As a material and the like thereof, the foregoing embodiment modes can be referred. That is, an inorganic material and an organic material can be used for the insulating layer 122.

Figure 4E:
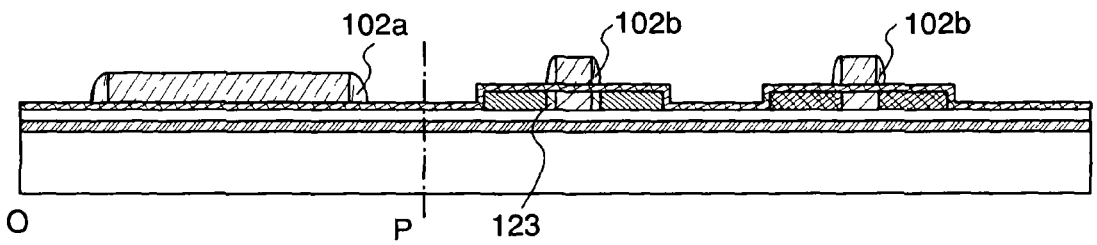

As shown in FIG. 4E, the insulating layer 122 is etched to have a sidewall structure. In the first region, a first layer 102a having a sidewall structure is formed to have a frame-shape around the sacrifice layer 104a. In the second region, a sidewall 102b is formed around the gate electrode 104b.

At this time, an impurity element may be further added to the semiconductor layer 113. A lightly doped drain region can be formed by adding an impurity element using the sidewall 102b. By providing the lightly doped drain region, a short-channel effect or hot electron deterioration which is caused when a gate length of a semiconductor element is shortened can be prevented. Such a structure is called an LDD (Lightly Doped Drain) structure. When a lightly doped drain region is overlapped with a gate electrode, a structure is called a GOLD (Gate Overlapped Drain) structure. In a p-channel thin film transistor, deterioration due to a hot carrier or a short-channel effect is hardly caused, so that a single-drain structure which does not have a lightly doped drain region can be formed. Therefore, as shown in FIG. 4E, a lightly doped drain region 123 is formed in an n-type semiconductor element. At this time, a mask is provided over the first region and the p-type semiconductor layer so as not to be doped with an impurity element.

Figure 5A:
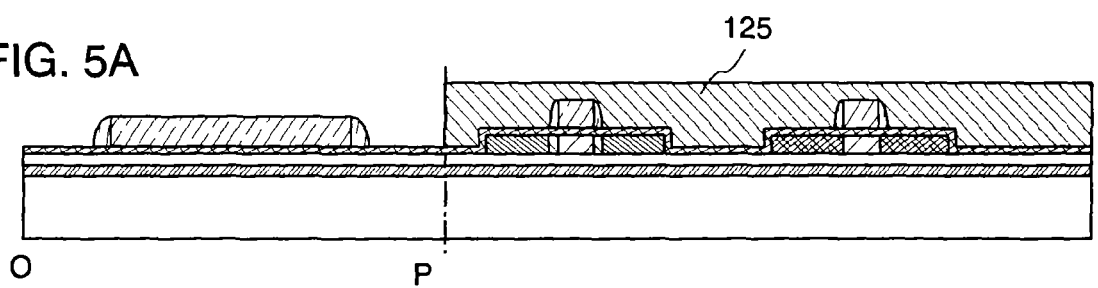
FIGS. 5A to 5C show a manufacturing process of a semiconductor device of the present invention.

Then, as shown in FIG. 5A, an insulating layer 125 is formed in the second region. The insulating layer 125 serves as an interlayer insulating layer. The insulating layer 125 can be formed using the same material and manufacturing method as that of the insulating layer 122. When planarity thereof needs to be enhanced, an organic material is preferably used for the insulating layer 125. The insulating layer 125 serving as an interlayer insulating layer may have a single-layer structure and a stacked-layer structure. When a stacked-layer structure is employed, for example, an insulating layer formed of an inorganic material can be formed as a lower layer and an insulating layer formed of an organic material can be formed as an upper layer. As a result, impurity contamination can be reduced and planarity can be ensured.

Figure 5B:
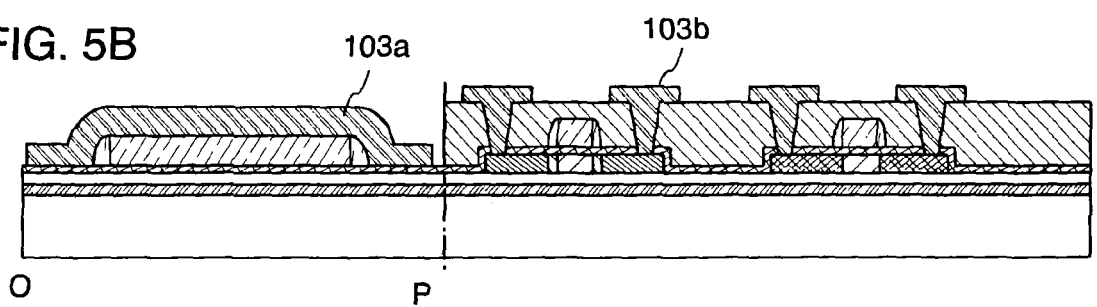

As shown in FIG. 5B, in the first region and the second region, a second layer 103 having a conductive layer is formed and patterned into a predetermined shape. In the first region, the second layer 103 serves as a conductive layer 103a and in the second region, the second layer 103 serves as an electrode 103b connected to an impurity region. An electrode which is connected to a source region is called a source electrode while an electrode which is connected to a drain region is called a drain electrode. In addition, as shown in the foregoing embodiment modes, the conductive layer 103a is patterned into an elongated rectangular shape which crosses over the first layer 102a and the sacrifice layer 104a.

Figure 5C:
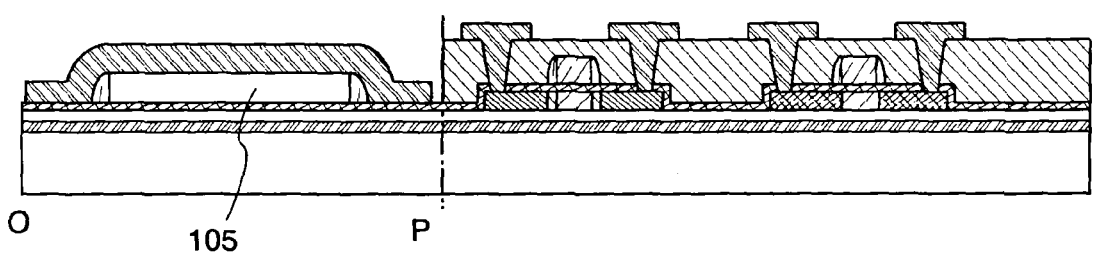

As shown in FIG. 5C, in the first region, the sacrifice layer 104a is removed. The sacrifice layer 104a can be removed without forming an opening because a part of the sacrifice layer 104a is exposed by patterning of the conductive layer 103a. If the sacrifice layer 104a is not exposed in the patterning of the conductive layer 103a, an opening is formed in a predetermined portion. Then, a space 105 can be formed by etching and removing the sacrifice layer 104a as described in the foregoing embodiment modes. Capacity is formed by the lower electrode 110 and the conductive layer 103 with the space 105 therebetween to serve as a measurement element. In addition, a measurement element is controlled using a semiconductor element formed over the same substrate.

Thus, a measurement element and a semiconductor element for controlling the measurement element can be formed over one surface in one step. In addition, by integrating the measurement element and the semiconductor element, a manufacturing cost can be reduced. Further, productivity can be improved compared with a conventional structure in which an electric circuit is formed separately and then electrically connected to a minute structure. In addition, miniaturization of a semiconductor device can be realized since a connection region between a measurement element and a semiconductor element controlling the measurement element is not required.

In this embodiment mode, a manufacturing process of a measurement element and a semiconductor device controlling the measurement element is described. This embodiment mode can be freely combined with any one of the forgoing embodiments of the measurement element shown in Embodiment Modes 1 to 4.

Embodiment Mode 6

In this embodiment mode, a measurement element having a structure which is different from that of the foregoing embodiment modes and a semiconductor element controlling the measurement element are described.

Figure 6:
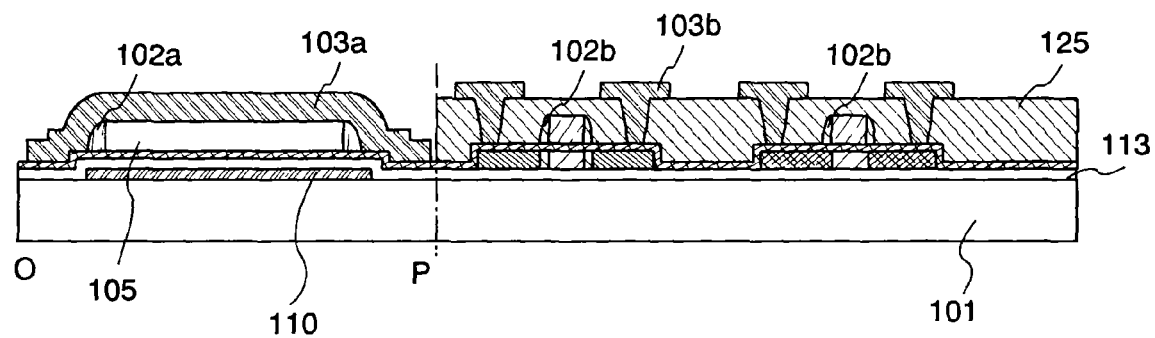
FIG. 6 is a cross-sectional view of a semiconductor device of the present invention.

As shown in FIG. 6, a lower electrode 110 is formed selectively in the first region. That is, in the second region, a lower electrode is not formed. A semiconductor element does not necessarily have a lower electrode.

In addition to the foregoing structure of the semiconductor element, a bottom gate structure in which a gate electrode is provided under a semiconductor layer can be employed as well as a top gate structure in which a gate electrode is provided over the semiconductor layer. When using a bottom gate structure, a lower electrode in a first region and a lower gate electrode in a second region can be formed in one step. As for a subsequent step, the foregoing embodiment modes can be referred.

Thus, the present invention is not limited to a structure of the semiconductor element, as long as the measurement element and the semiconductor element can be integrated over one surface.

In addition, the measurement element and the semiconductor element formed over an insulating surface may be transferred to another substrate. For example, a measurement element and a semiconductor element formed using a glass substrate may be transferred to a plastic substrate. In this case, a measurement element and a semiconductor element are formed over a peeling layer, the peeling layer is removed physically or chemically to peel the glass substrate, and the measurement element and the semiconductor element are fixed over a plastic substrate. As a result, a device which is significantly light and thin can be formed.

In this embodiment mode, a manufacturing process of a measurement element and a semiconductor device for controlling the measurement element is described. This embodiment mode can be freely combined with any one of the forgoing embodiments of the measurement element shown in Embodiment Modes 1 to 4.

Embodiment Mode 7

In this embodiment mode, a structure of an organic transistor using the foregoing minute structure is described. In this embodiment mode, an organic transistor which is a bottom gate type in which a gate electrode is formed under a semiconductor layer and which is a top contact type in which a source electrode and a drain electrode are provided over the semiconductor layer is described.

Figure 7:
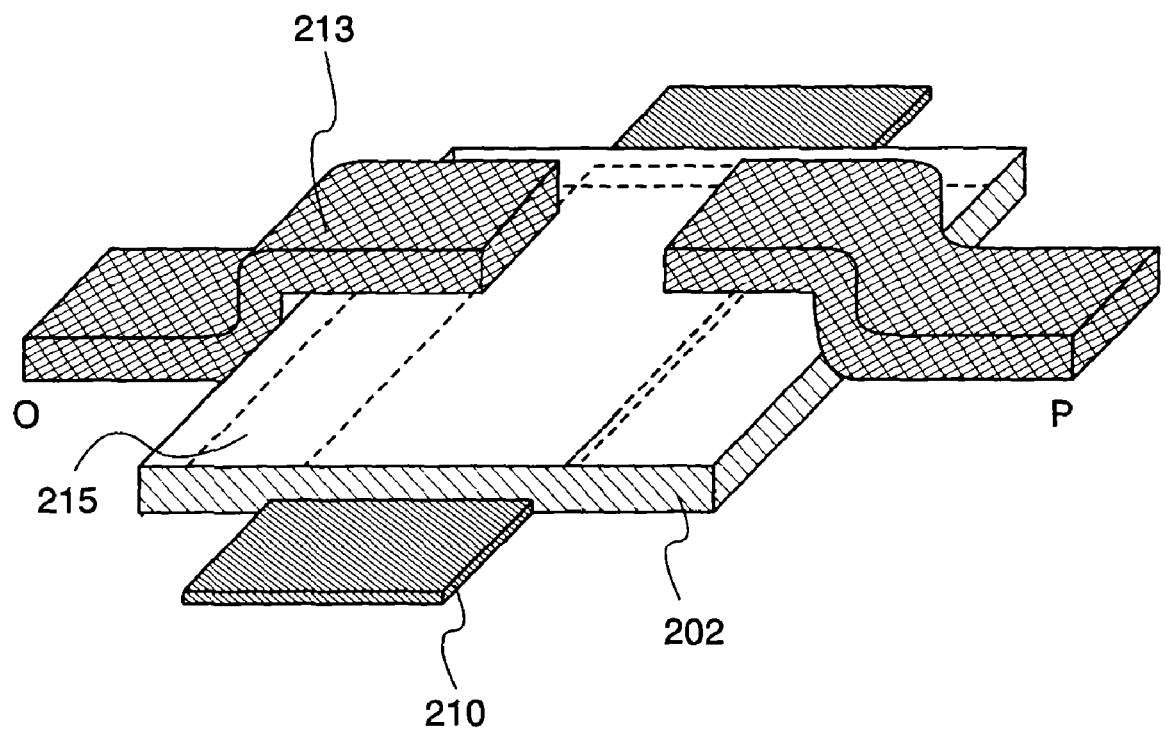
FIG. 7 shows an organic transistor of the present invention.
Figure 8A:
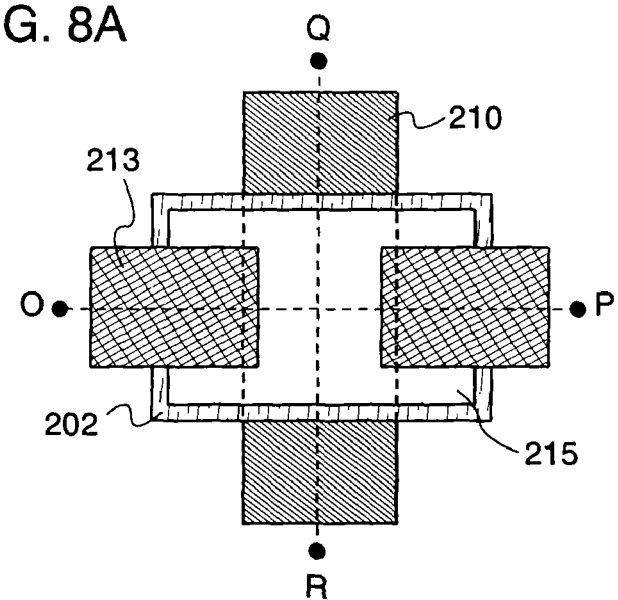
FIGS. 8A to 8C show an organic transistor of the present invention.
Figure 8B:
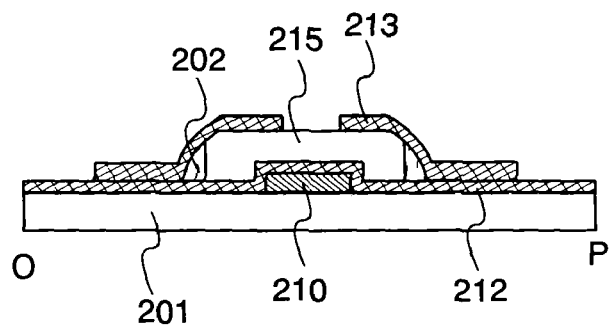
Figure 8C:
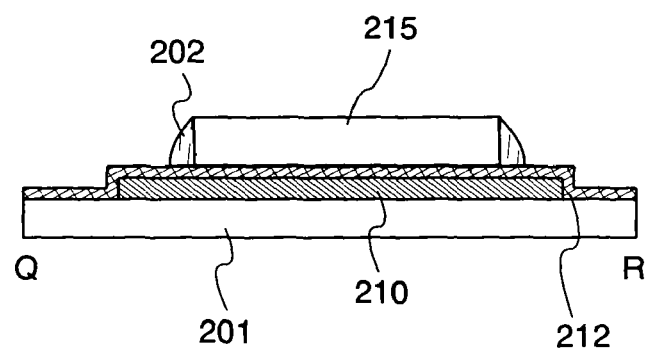

FIG. 7 shows a cross-sectional view of a bottom gate type organic transistor. FIG. 8A shows a top view of the organic transistor, FIG. 8B shows a cross-sectional view taken along a line O-P, and FIG. 8C shows a cross-sectional view taken along a line Q-R. The organic transistor has a lower electrode 210 serving as a gate electrode, a first layer 202 having a frame-shape and a sidewall structure formed over the lower electrode 210, an organic semiconductor layer 215 which is formed inside the first layer 202, and a third layer 213 serving as a source electrode and a drain electrode which overlaps the lower electrode 210 and is formed over the organic semiconductor layer 215; over an insulating surface. The second layer 213 is divided above the lower electrode so as to serve as the source electrode and the drain electrode. A space is formed by removing a sacrifice layer so that the first layer 202 has a frame-shape. A stiffener may be formed so as to keep a condition of the second layer 213 after forming the space and before forming the organic semiconductor layer 215. The stiffener can be formed below or over the second layer 213 and preferably formed to contain a silicon oxide, a silicon nitride, or the like; which is because a silicon oxide and silicon nitride are tougher than a conductive material.

The organic semiconductor layer 215 may be formed using an organic molecular crystal or an organic high molecular weight compound. As a specific example of the organic molecular crystal, a polycyclic aromatic compound, a conjugated double bond compound, phthalocyanine, a charge-transfer complex, or the like can be given. For example, anthracene, tetracene, pentacene, hexathiophene (6T), tetracyanoquinodimethane (TCNQ), perylenetetracarboxylic dianhydride (PTCDA), naphthalenetetracarboxylic dianhydride (NTCDA), or the like can be used. As a specific example of the organic high molecular weight compound, a π-conjugated high molecular weight material, a carbon nanotube, polyvinyl pyridine, a phthalocyanine metal complex, or the like can be given. In particular, polyacetylene, polyaniline, polypyrrole, polyethylene, a polythiophene derivative, poly(3 alkylthiophene), a polyparaphenylene derivative, or a polyparaphenylene vinylene derivative can be employed, each of which is a conjugated high molecular weight material whose skeleton is formed with conjugated double bonds. These organic semiconductor materials include one exhibiting a polarity of n-type or p-type.

Such an organic semiconductor film can be formed by a vacuum evaporation method, a spin coating method, a spray method, a droplet discharging method (typically, an ink-jet method), a sol-gel method, a screen method, a cast method, or a pulling method. In the case of employing a dry deposition method such as a vacuum evaporation method, or a vapor-phase deposition method, a treatment is preferably conducted so that only the organic semiconductor layer has a hydrophobic property. On the other hand, in the case of employing a wet deposition method such as a spin coating method, a spray method, a droplet discharging method (typically, an ink-jet method), a sol-gel method, a screen method, a cast method, or a pulling method; a treatment is preferably conducted so that a region other than a region forming the organic semiconductor layer has a hydrophobic property. Thus, the organic semiconductor layer 215 is formed only inside the first layer 202 having a frame-shape.

The organic semiconductor layer 215 formed by a wet deposition method is dried with a predetermined temperature and time. By utilizing a capillary phenomenon when drying the organic semiconductor layer 215, the organic semiconductor layer 215 can be in contact with the second layer 212 serving as a source electrode and a drain electrode. That is, before drying the organic semiconductor layer 215, the organic semiconductor layer 215 is not necessarily in contact with the second layer 212 serving as a source electrode and a drain electrode.

The organic semiconductor layer 215 formed in this way does not requires a thermal treatment for crystallization. Therefore, an organic transistor can be formed even with a substrate with low heat resistance such as a plastic substrate.

The organic semiconductor layer 215 is formed inside the first layer 202 having a frame-shape and is not necessarily patterned. The first layer 202 can be used as a mold in which a material which is difficult to be pattern processed (such as ZnO, which is difficult to be etched or an organic material, which has low heat resistance) is poured and baked; therefore, the present invention is favorable.

Note that although a case using an organic transistor of a top contact type has been described, an organic transistor of a bottom contact type in which a source electrode and a drain electrode are provided blow a semiconductor layer may be used. In that case, a lower electrode 210 serving as a gate electrode is formed and an insulating layer serving as a gate insulating layer is formed so as to cover the lower electrode 210. Then, an electrode serving as a source electrode and a drain electrode is formed and a sacrifice layer and a first layer 202 which has a sidewall structure and a frame-shape, are formed thereover. Then, after removing the sacrifice layer, an organic semiconductor layer is formed inside the frame. Thus, the first layer having a frame-shape according to the present invention can be applied to an organic transistor of a bottom contact type.

In this embodiment mode, an embodiment of a semiconductor element is described. This embodiment mode can be freely combined with any one of the foregoing embodiments of a measurement element shown in Embodiment Modes 1 to 4. In addition, a semiconductor element and a measurement element can be formed over one substrate with reference to a manufacturing process in the forgoing Embodiment Modes 5 and 6.

Embodiment Mode 8

In this embodiment mode, unlike the foregoing embodiment modes, a structure of an organic transistor of a top gate type is described.

Figure 9:
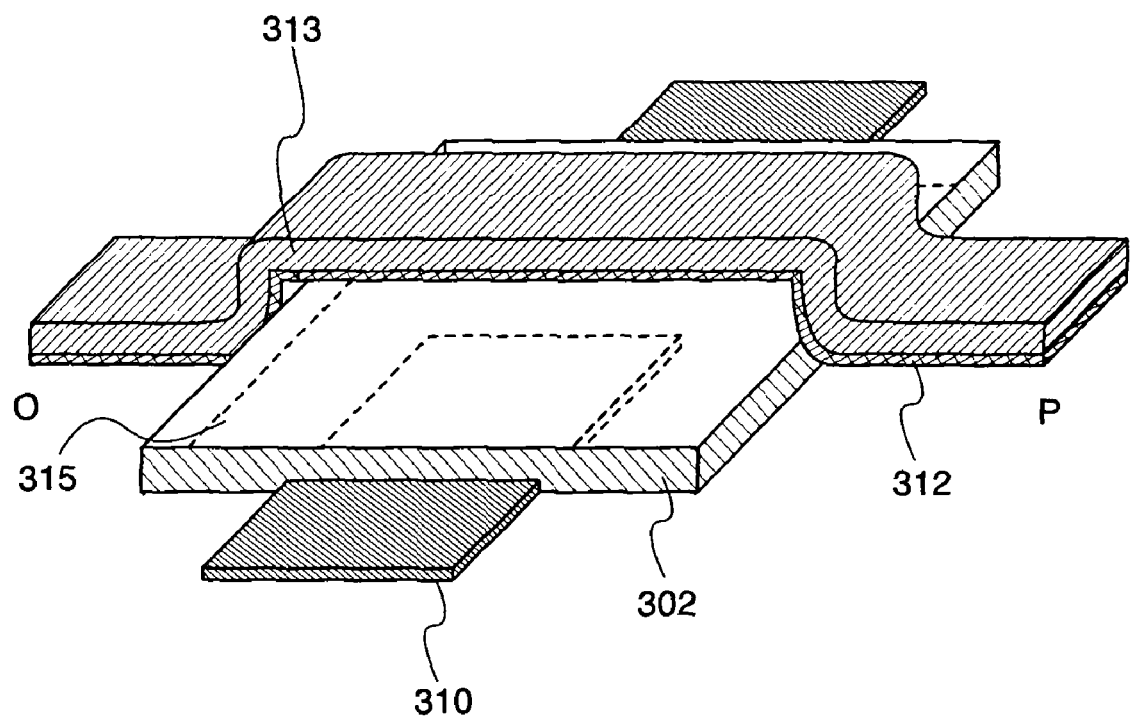
FIG. 9 shows an organic transistor of the present invention.

FIG. 9 shows a cross-sectional view of a top gate type organic transistor.

Figure 10A:
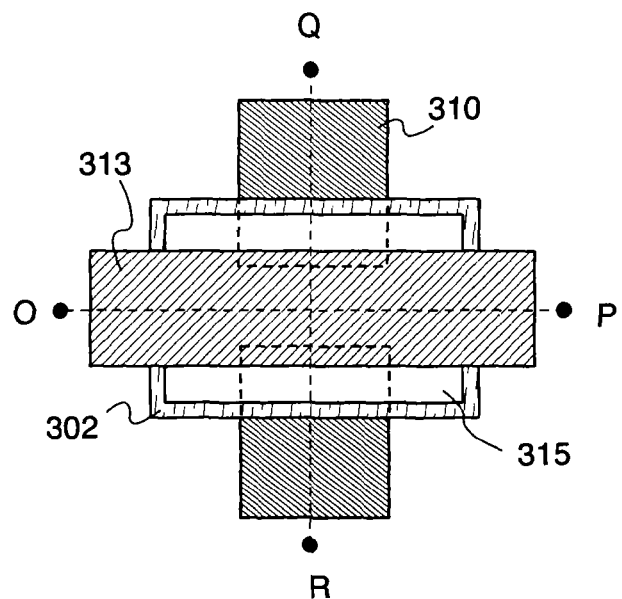
FIGS. 10A to 10C show an organic transistor of the present invention.
Figure 10B:
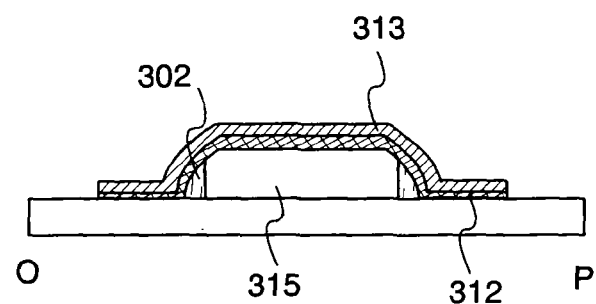
Figure 10C:
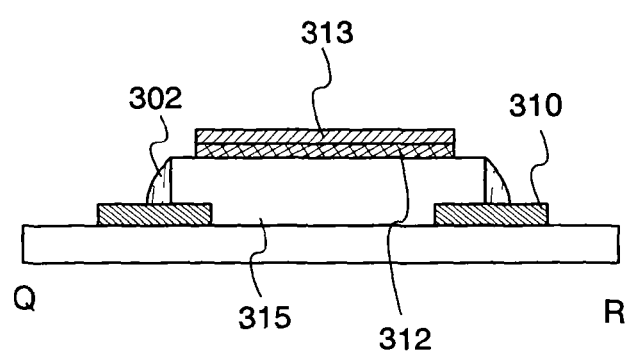

FIG. 10A shows a top view of the organic transistor, FIG. 10B shows a cross-sectional view taken along a line O-P, and FIG. 10C shows a cross-sectional view taken along a line Q-R. The organic transistor has a lower electrode 310 serving as a source electrode and a drain electrode, a first layer 302 having a frame-shape and a sidewall structure, an organic semiconductor layer 315 which is formed inside the first layer 302, an insulating layer 312 serving as a gate insulating layer which is formed over the organic semiconductor layer 315 and overlaps the lower electrode 310, and a second layer 313 serving as a gate electrode over the insulating layer 312. The lower electrode 310 serving as the source electrode and the drain electrode is divided below the organic semiconductor layer 315. A space is formed by removing a sacrifice layer so that the first layer 302 has a frame-shape. A stiffener may be formed so as to keep a condition of the second layer 313 after forming the space and before forming the organic semiconductor layer 315. The stiffener can be formed below or over the second layer 313 and preferably formed to contain a silicon oxide, a silicon nitride, or the like; which is because a silicon oxide and silicon nitride are tougher than a conductive material.

As a material and a manufacturing method of the organic semiconductor layer 315, the foregoing embodiment modes can be referred.

The organic semiconductor layer 315 formed by a wet deposition method is dried with a predetermined temperature and time. By utilizing a capillary phenomenon when drying the organic semiconductor layer 315, the organic semiconductor layer 315 can be in contact with the second layer 313 serving as a gate electrode. That is, before drying the organic semiconductor layer 315, the organic semiconductor layer 315 may not necessarily be in contact with the second layer 313 serving as a gate electrode.

The organic semiconductor layer 315 formed in this way does not require a thermal treatment for crystallization. Therefore, an organic transistor can be formed even with a substrate with low heat resistance such as a plastic substrate.

The organic semiconductor layer 315 is formed inside the first layer 302 having a frame-shape and is not necessarily patterned. The first layer 315 can be used as a mold in which a material which is difficult to be pattern processed (such as ZnO, which is difficult to be etched or an organic material, which has low heat resistance) is poured and baked; therefore, the present invention is favorable.

In this embodiment mode, an embodiment of a semiconductor element is described. This embodiment mode can be freely combined with any one of the forgoing embodiments of a measurement element shown in Embodiment Modes 1 to 4. In addition, a semiconductor element and a measurement element can be formed over one substrate with reference to a manufacturing process in the forgoing Embodiment Modes 5 and 6.

Embodiment Mode 9

In this embodiment mode, electric appliances using an organic transistor shown in the foregoing embodiment modes are described.

As shown in FIGS. 11A to 11D, the forgoing organic transistor can be used as a switching element of a display portion mounted over a electric appliance such as a flexible electronic paper, a cellular phone, and a television receiver. In addition, the forgoing organic transistor may be mounted over a card having a function of managing individual information such as an ID card.

Figure 11A:
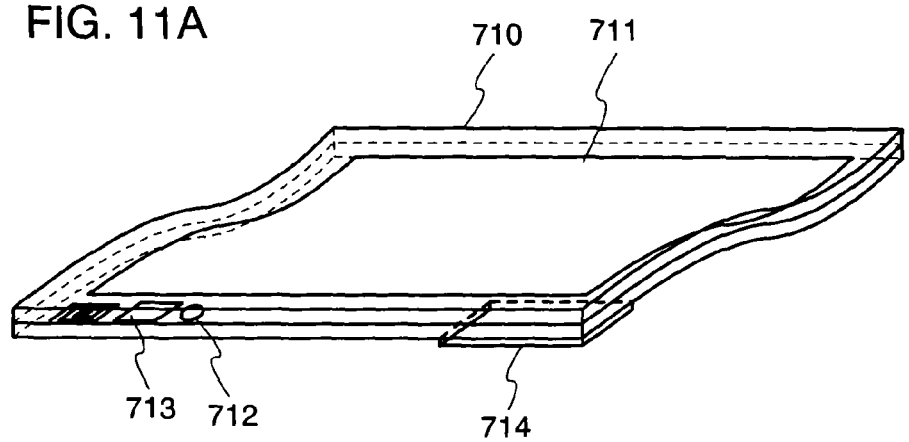
FIGS. 11A to 11D show electric appliances of the present invention.

FIG. 11A is an electronic paper to which the present invention is applied. The electronic paper has a main body 710, a display portion 711, a receiver 712, a driver circuit 713, a film-shaped battery 714, and the like.

In the display portion 711, an organic transistor of the present invention is provided as a switching element. A display method may be a liquid crystal display method, an EL display method having a self-light emitting element, or a microcapsule electrophoresis method. Each pixel of the display portion 711 has an organic transistor and the organic transistor has a first layer having a frame-shape shown in the foregoing embodiment modes. Thus, by providing a space inside the first layer having a frame-shape, light transmittance is increased. By providing such a switching element having high light transmittance to a display portion, an electronic paper having a high aperture ratio can be provided. In addition, the driver circuit 713 for driving a receiver 712 and a switching element and the organic transistor are formed or mounted over one substrate. The organic transistor of the present invention can be formed over a flexible substrate such as a plastic substrate, so that it is highly effective to apply the organic transistor to an electronic paper. Thus, an electronic paper having a high aperture ratio can be manufactured by using the organic transistor of the present invention.

Figure 11B:
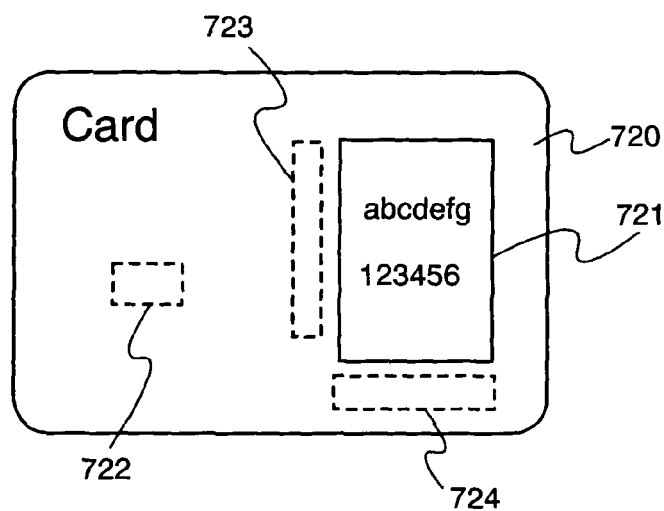

FIG. 11B shows a card to which the present invention is applied. The card has a supporting body 720, a display portion 721, an integrated circuit chip 722 incorporated in the supporting body 720, and the like. Note that integrated circuits 723 and 724 for driving an element formed in the display portion 721 are also incorporated in the supporting body 720.

In the display portion 721, an organic transistor of the present invention is provided as a switching element. A display method may be a liquid crystal display method or an EL display method having a self-light emitting element. Each pixel of the display portion 721 has an organic transistor and the organic transistor has a first layer having a frame-shape shown in the foregoing embodiment modes. Thus, by providing a space inside the first layer having a frame-shape, light transmittance is increased. By providing such a switching element having high light transmittance to a display portion, a card having a high aperture ratio can be provided. In addition, the integrated circuits 723 and 724 for driving the display portion 721 and the organic transistor are formed or mounted over one substrate. The organic transistor of the present invention can be formed over a flexible substrate such as a plastic substrate, so that it is highly effective to apply the organic transistor to a display portion of the card. Thus, a card having a high aperture ratio can be manufactured by using the organic transistor of the present invention. Information inputted to and outputted from the integrated chip 722 can be displayed on the display portion 721, so that a user can see the information which is inputted and outputted.

Figure 11C:
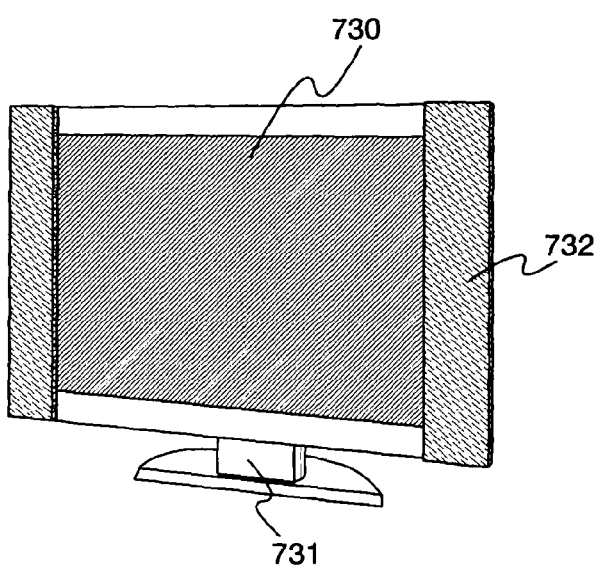

FIG. 11C shows a television receiver to which the present invention is applied. The television receiver has a display portion 730, a housing 731, a speaker 732, and the like.

In the display portion 730, an organic transistor of the present invention is provided as a switching element. A display method may be a liquid crystal display method or an EL display method having a self-light emitting element. Each pixel of the display portion 730 has an organic transistor and the organic transistor has a first layer having a frame-shape shown in the foregoing embodiment modes. Thus, by providing a space inside the first layer having a frame-shape, light transmittance is increased. By providing such a switching element having high light transmittance to a display portion, a television receiver having a high aperture ratio can be provided. In addition, the integrated circuit for driving a display portion 730 and the organic transistor are formed or mounted over one substrate. The organic transistor of the present invention can be formed over a flexible substrate such as a plastic substrate, so that it is highly effective to apply the organic transistor to a card. Thus, a television receiver having a high aperture ratio can be manufactured by using the organic transistor of the present invention.

Figure 11D:
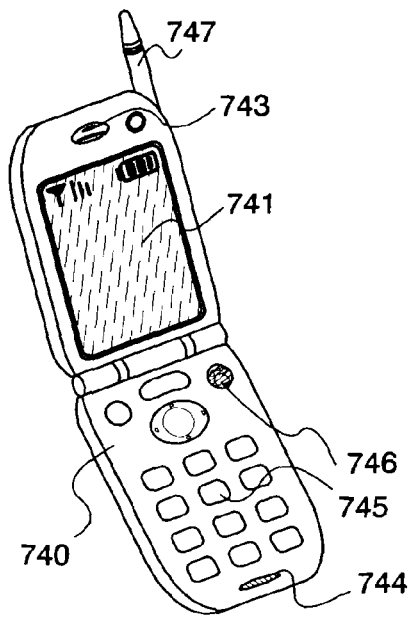

FIG. 11D shows a cellular phone. The cellular phone has a main body 740 which includes a display portion 741, an audio output portion 743, an audio input portion 744, operation switches 745 and 746, an antenna 747, and the like.

In the display portion 741, an organic transistor of the present invention is provided as a switching element. A display method may be a liquid crystal display method or an EL display method having a self-light emitting element. Each pixel of the display portion 741 has an organic transistor and the organic transistor has a first layer having a frame-shape shown in the foregoing embodiment modes. Thus, by providing a space inside the first layer having a frame-shape, light transmittance is increased. By providing such a switching element having high light transmittance to a display portion, a cellular phone having a high aperture ratio can be provided. In addition, an integrated circuit for driving a display portion 741 and the organic transistor are formed or mounted over one substrate. The organic transistor of the present invention can be formed over a flexible substrate such as a plastic substrate, so that it is highly effective to apply the organic transistor to a card. Thus, a cellular phone having a high aperture ratio can be manufactured by using the organic transistor of the present invention.

Although a case where the organic transistor to which the present invention is applied is mounted over an electric appliance is described, a measurement element having a structure of the present invention may be applied to an electric appliance.

As described above, applicability of the present invention is significantly wide, and can be used for a display device in various fields.

Embodiment

In this embodiment, an SEM (scanning electron microscope) photograph of a structure having a sidewall structure of the present invention is described.

A sacrifice layer was formed using tungsten and patterned to have a rectangle shape. The sacrifice layer was patterned by dry etching with a pressure of 13.5 Pa (13.5/133 Torr), a voltage of 500 W applied to an upper electrode (equivalent to an ICP electrode), a voltage of 10 W applied to a lower electrode (equivalent to a bias electrode), and etchant of $Cl_2$, $CF_4$, and $O_2$ with respective flow amount of 50.4 sccm, 50.4 sccm, and 20.4 sccm. Over etching of 30% from an endpoint at which the sacrifice layer was removed was conducted. At this time, a first thickness was 1000 nm.

Thereafter a first layer was stacked over the removed sacrifice layer and the first layer was patterned so as to remain at one side of the sacrifice layer, that is, to have a sidewall-shape. At this time, a second thickness was 900 nm. As for patterning of the first layer, dry etching was conducted. At a first step, etching was conducted for 3 seconds with a pressure of 5.5 Pa (5.5/133 Torr), a voltage of 475 W applied to an upper electrode (equivalent to an ICP electrode), a voltage of 300 W applied to a lower electrode (equivalent to a bias electrode), and etchant of $CHF_3$ and He with respective flow amount of 50 sccm and 150 sccm. At a second step, etching was conducted for 60 seconds with a pressure of 5.5 Pa (5.5/133 Torr), a voltage of 475 W applied to an upper electrode (equivalent to an ICP electrode), a voltage of 300 W applied to a lower electrode (equivalent to a bias electrode), and etchant of $CHF_3$ and He with respective flow amount of 7.5 sccm and 142.5 sccm. At a third step, etching was conducted for 360 seconds with a pressure of 5.5 Pa (5.5/133 Torr), a voltage of 50 W applied to an upper electrode (equivalent to an ICP electrode), a voltage of 450 W applied to a lower electrode (equivalent to a bias electrode), and etchant of $CHF_3$ and He with respective flow amount of 48 sccm and 152 sccm.

Then, a second layer was formed with a silicon oxide over the sacrifice layer and the first layer which is formed so as to have a sidewall-shape. The second layer was patterned to have an elongated rectangular shape. That is, the second layer was formed so as to cross over the sacrifice layer and the first layer having a sidewall structure. In other words, the second layer was formed so as to cross over from one side of the sacrifice layer and the first layer having a sidewall-shape to another side which was opposite to the side.

Then, the sacrifice layer was removed by etching. As for the etching, wet etching with etchant of mixture containing ammonia (28%):hydrogen peroxide water (31%):water with a ratio of 2:5:2 was used.

Figure 12:
FIG. 12 is an SEM picture showing a minute structure of the present invention.
Figure 13:
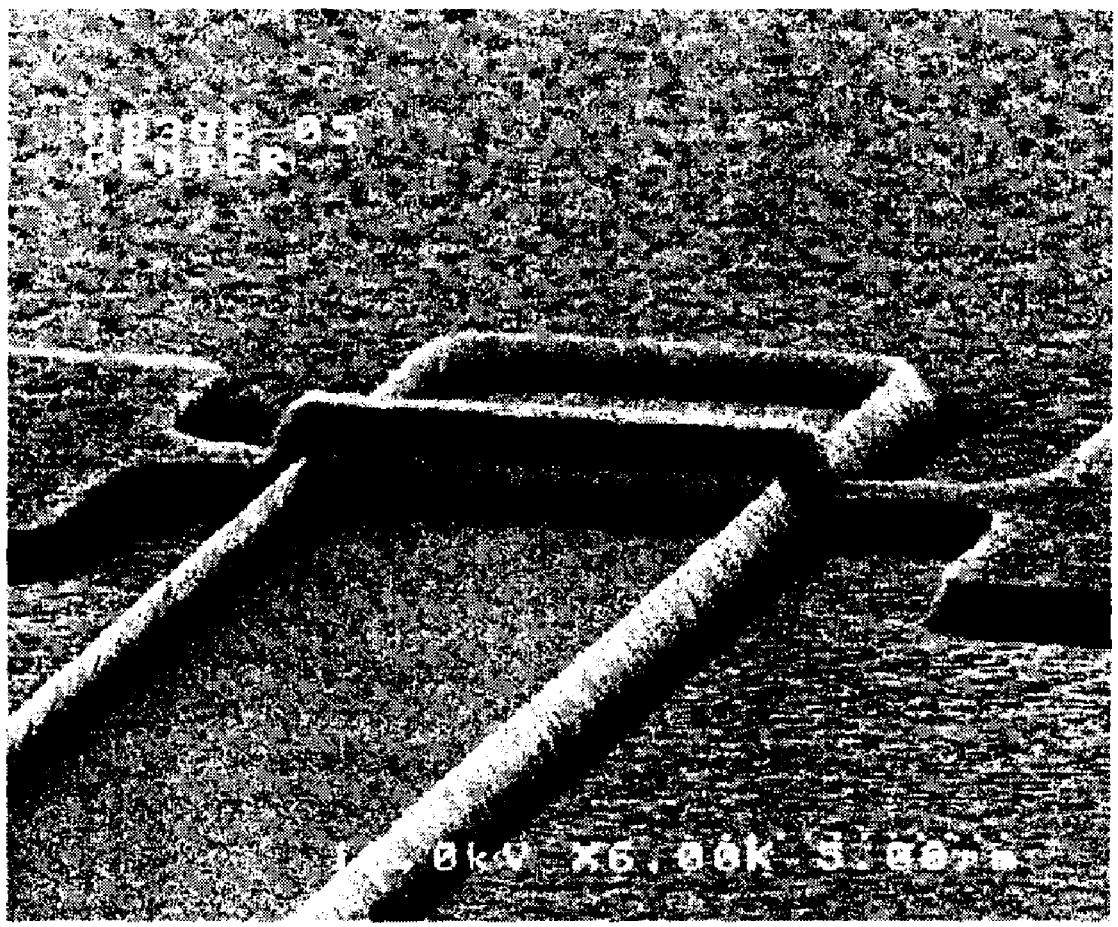
FIG. 13 is an SEM picture showing a minute structure of the present invention.

FIG. 12 shows a result of the structure. FIG. 13 shows an enlarged view thereof. Only a sacrifice layer formed of W is removed to form a space inside a frame. In addition, the first layer has a sidewall-shape. The second layer is not etched and has an elongated rectangular shape crossing over the first layer. Such a second layer is movable due to a space, for example the second layer over the space can move up and down.

This application is based on Japanese Patent Application serial no. 2005-193154 filed in Japan Patent Office on Jun. 30, 2005, the entire contents of which are hereby incorporated by reference.

What is claimed is:

1. A MEMS structure comprising:
   a pair of walls formed over an insulating surface; and
   a bridge crossing over the pair of walls,
   wherein the bridge is movable and in contact with side surfaces of the walls from top parts of the walls to bottom parts of the walls,
   wherein the walls are tapered to the top parts of the walls such that the bottom parts of the walls are thicker than the top parts of the walls, and
   wherein the side surfaces of the walls present convex curved shapes.

2. A MEMS structure comprising:
   a first layer formed over an insulating surface, wherein the first layer forms a frame; and
   a second layer formed over the insulating surface,
   wherein the second layer is formed so as to cross over the frame and to be in contact with a side surface of the frame from a top part of the frame to a bottom part of the frame, and is movable,
   wherein the frame of the first layer is tapered to the top part of the frame such that the bottom part of the frame is thicker than the top part of the frame, and
   wherein the side surface of the frame presents a convex curved shape.

3. The minute structure according to claim 2, wherein the first layer contains an insulating layer, and the second layer contains a conductive layer.

4. The minute structure according to claim 2, wherein the second layer moves up and down.

5. A MEMS structure comprising:
   a first layer formed over an insulating surface, wherein the first layer forms a frame; and
   a second layer formed over the insulating surface, wherein the second layer is formed so as to cross over the frame from a side to another side which is opposite to the side, and is movable, wherein a lower surface of the second layer is in contact with a side surface of the frame from a top part of the frame to a bottom part of the frame, wherein the frame of the first layer is tapered to the top part of the frame such that the bottom part of the frame is thicker than the top part of the frame, and wherein the side surface of the frame presents a convex curved shape.

6. The minute structure according to claim 5, wherein the first layer contains an insulating layer, and the second layer contains a conductive layer.

7. The minute structure according to claim 5, wherein the second layer moves up and down.

8. A MEMS structure comprising:

a plurality of minute structures, each including a pair of walls formed over an insulating surface and a bridge crossing over the pair of walls and in contact with side surfaces of the walls from top parts of the walls to bottom parts of the walls, wherein the bridge is movable, and wherein the walls are tapered to the top parts of the walls such that the bottom parts of the walls are thicker than the top parts of the walls, and wherein the side surfaces of the walls present convex curved shapes.

9. The micromachine according to claim 8, wherein the micromachine has a lower electrode formed below the pair of walls.

10. A MEMS structure comprising:

a plurality of minute structures, each including a first layer and a second layer formed over an insulating surface, wherein the first layer forms a frame, wherein the second layer is formed so as to cross over the frame and to be in contact with a side surface of the frame from a top part of the frame to a bottom part of the frame, and is movable, and wherein the frame of the first layer is tapered to the top part of the frame such that the bottom part of the frame is thicker than the top part of the frame, and wherein the side surface of the frame presents a convex curved shape.

11. The micromachine according to claim 10, wherein the micromachine has a lower electrode formed below the first layer.

12. The micromachine according to claim 10, wherein the first layer contains an insulating layer, and the second layer contains a conductive layer.

13. The micromachine according to claim 10, wherein the second layer moves up and down.

14. A MEMS structure comprising:

a plurality of minute structures, each including a first layer and a second layer formed over an insulating surface, wherein the first layer forms a frame, wherein the second layer is formed so as to cross over the frame from a side to another side which is opposite to the side, and is movable, wherein a lower surface of the second layer is in contact with a side surface of the frame from a top part of the frame to a bottom part of the frame, and wherein the frame of the first layer is tapered to the top part of the frame such that the bottom part of the frame is thicker than the top part of the frame, and wherein the side surface of the frame presents a convex curved shape.

15. The micromachine according to claim 14, wherein the micromachine has a lower electrode formed below the first layer.

16. The micromachine according to claim 14, wherein the first layer contains an insulating layer, and the second layer contains a conductive layer.

17. The micromachine according to claim 14, wherein the second layer moves up and down.

* * * * *